United States Patent [19]
Kos

[11] Patent Number: 5,154,301
[45] Date of Patent: Oct. 13, 1992

[54] WAFER CARRIER
[75] Inventor: Robert D. Kos, Victoria, Minn.
[73] Assignee: Fluoroware, Inc., Chaska, Minn.
[21] Appl. No.: 758,604
[22] Filed: Sep. 12, 1991
[51] Int. Cl.$^5$ .............................................. A47G 19/08
[52] U.S. Cl. .................................... 211/41; 206/454; 118/500
[58] Field of Search ................... 211/41, 26; 206/454; 118/500; 414/405

[56] References Cited
U.S. PATENT DOCUMENTS
4,687,097 8/1987 Mortensen ................. 206/454 X
4,949,848 8/1990 Kos .
5,042,671 8/1991 Bischoff et al. ..................... 211/41

Primary Examiner—Blair M. Johnson
Attorney, Agent, or Firm—Palmatier & Sjoquist

[57] ABSTRACT

A moldable plastic, distortion and warp resistant wafer carrier with forked end wall portions that tie into the sidewalls of the carrier. The forked end wall portions from triangular column like supports between an end wall and sidewalls of the carrier such that the carrier maintains structural integrity even when its temperature fluctuates between ambient and 180° C. temperatures in a relatively short time period. The structural integrity of the carrier is further enhanced by the end wall having an integrally formed bend which is disposed at a right angle relative to the forked end wall portions.

13 Claims, 1 Drawing Sheet

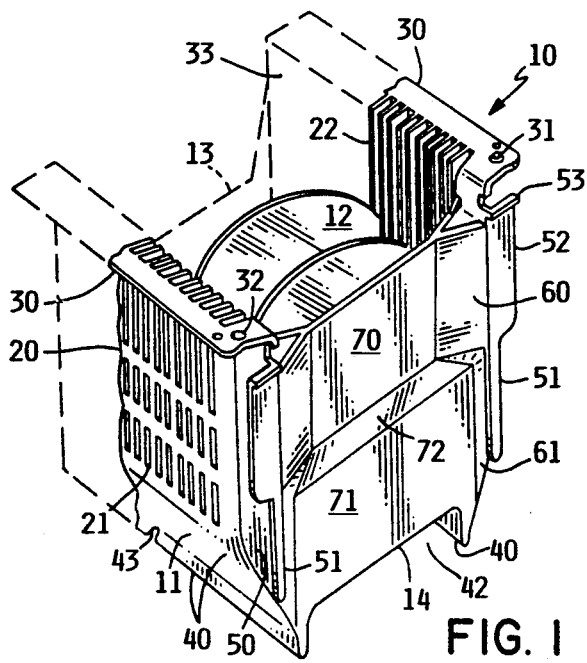
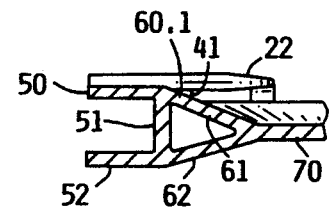
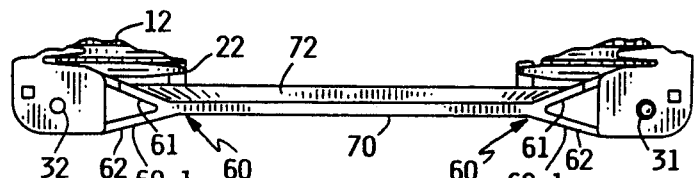
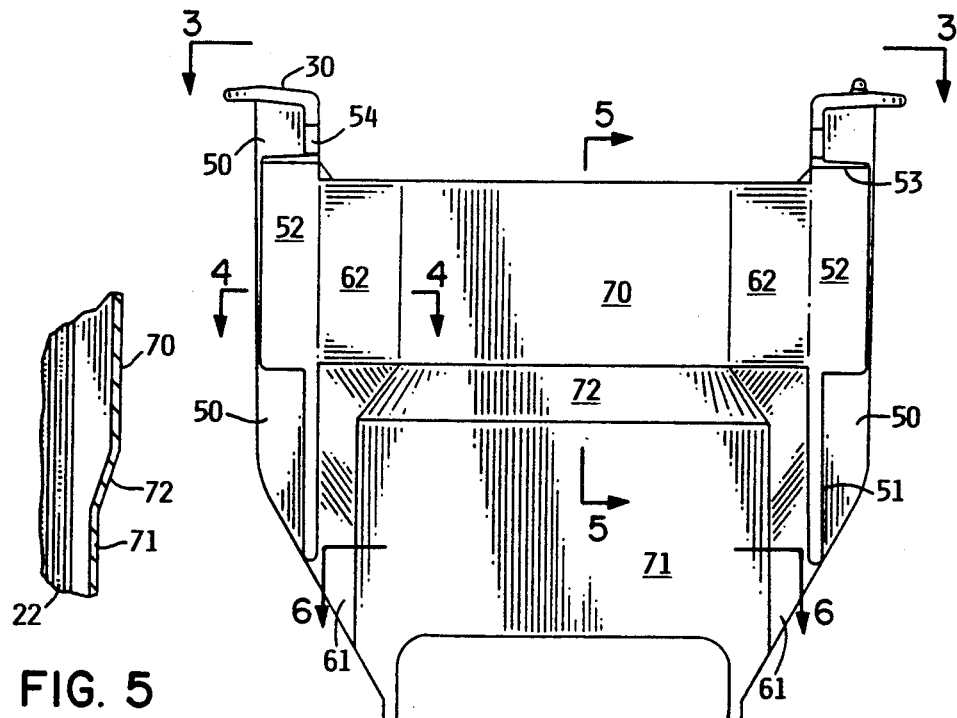

WAFER CARRIER

BACKGROUND OF THE INVENTION

The present invention relates to wafer carriers and, more particularly, to wafer carriers for holding semiconductor wafers during the chemical treatment thereof, and particularly large wafers up to and in excess of 200 mm diameter.

A silicon wafer forms the basis for the production of a plurality of integrated circuit chips. It is typically only a few thousandths of an inch thick, and thus may be relatively delicate and brittle.

The wafers are chemically treated in fluids of up to approximately 180° C., and sometimes at higher temperatures. During treatment, the wafers are conventionally held in the wafer carriers which in turn are manipulated by robotic handling mechanisms. After treatment, the wafers and wafer carriers are cooled relatively rapidly to ambient temperatures. Previously known wafer carriers, such as is disclosed in U.S. Pat. No. 4,949,848, have improved resistance to distortion and warpage, however the materials available continue to soften under influence of high operating temperatures.

SUMMARY OF THE INVENTION

A feature of the present invention is the provision in a wafer carrier having ribbed side frame portions for engaging wafers, of an end frame portion including a pair of forked end wall portions leading into and being integral with the side frame portions to enhance the structura integrity of the wafer carrier.

Another feature is the provision in such a wafer carrier, of a bent end wall portion wherein the bend is disposed substantially at a right angle to the forked end wall portions.

Another feature is the provision in such a wafer carrier, of the forked end wall portions, bent end wall portions, and other end wall portions being of the same thickness to minimize warping of the wafer carrier caused by different rates of expansion and contraction in response to heating and cooling during and after chemical treatment of the wafers.

Another feature is the provision in such a wafer carrier, of the forked end wall portions disposed adjacent to and supporting integrally formed flanges which are engaged by handling mechanisms during the various steps of chemical treatment, rinsing, drying and transferring the wafers.

Another feature is the provision in such a wafer carrier, of each of the forked end wall portions being formed by a pair of end panel portions which lead into and form a triangular column-like support between the end frame portion and its respective side frame portion.

Another feature is the provision in such a wafer carrier, of one of the end panel portions being greater in length than its respective adjacent end panel portion to engage the bent end wall portion.

An advantage of the present invention is that larger carriers may be formed for holding larger wafers.

Another advantage is that larger wafer carriers may have a greater amount of structural integrity and be more resistant to warpage and distortion which may be caused by relatively rapid heat transfer.

Another advantage is that waste of the wafers is minimized. Typically, a peripheral region of a wafer is less desirable for forming integrated circuit chips. By using a wafer having a greater diameter, a greater number of integrated circuit chips may be produced for each of the wafers being processed.

BRIEF DESCRIPTION OF THE DRAWINGS

FIG. 1 is a perspective, partially phantom view of the present wafer carrier.

FIG. 2 is an end elevation view of the wafer carrier of FIG. 1.

FIG. 3 is a partial plan view of the wafer carrier at lines 3—3 of FIG. 2.

FIG. 4 is a section view at lines 4—4 of FIG. 2.

FIG. 5 is a detail section view of the wafer carrier taken at lines 5—5 of FIG. 2.

FIG. 6 is a detail section view of the wafer carrier at lines 6—6 of FIG. 2.

DETAILED DESCRIPTION OF THE PREFERRED EMBODIMENTS

As shown in FIG. 1, the present wafer carrier is indicated in general by the reference numeral 10 and includes a pair of ribbed side frame portions 11 disposed transversely of each other for engaging silicon wafers 12 therebetween. The ribbed side frame portions 11 are fixed in a spaced apart relationship by a pair of end frame portions 13, 14. End frame portion 13 is typically formed in the shape of an "H" with the wafer carrier 10. The one-piece wafer carrier 10, including side frame portions 11 and end frame or end wall portions 13, 14, is typically injection molded of PFA Teflon ® (a registered trademark of E. I. du Pont de Nemours Co.), a perfluoralkoxy-substituted polytetrafluoroethylene resin. A wide range of other moldable materials are also used in carriers for various uses.

Each of the ribbed side frame portions 11 includes an upright sidewall 20 having a plurality of wash slots 21 for fluid flow to and from the wafers 12. Each of the sidewalls 20 further includes a plurality of elongate inwardly extending teeth 22 for engaging and spacing the wafers 12 apart from each other.

A pair of lips or flanges 30 are integrally formed on the sidewalls 20 and extend outwardly therefrom for being manipulated by, for example, robotic handling mechanisms. Each of the lips 30 include pins 31 or holes 32 for engaging other like pins and holes of another wafer carrier 10 during a dump transfer of the wafers 12 from one wafer carrier 10 to another wafer carrier 10. The lips 30 and teeth 22 form an open top or access opening 33 through which the wafers 12 are inserted and removed from the wafer carrier 10 and through which fluid flow occurs to and from the wafers 12.

A pair of tapering foot panels 40 are formed integrally with the sidewalls 20 opposite of the lips 30. Each of the foot panels 40 includes a surface portion 41 for engaging the wafers 12. The distance between the surface portions 41 is less than the diameter of one of the wafers 12 to retain the wafers 12 in the wafer carrier 10. The foot panels 40 define an open bottom or fluid opening 42 through which fluid flow occurs to and from the wafers 12. Each of the foot panels 40 further includes an indexing notch 43 which permits alignment of the wafer carrier 10 on a particular handling mechanism.

Each of the side frame portions 11 further includes a side panel 50 extending inwardly at a right angle from its respective sidewall 20 and from a portion of its respective tapering foot panel 40. Each of the side frame portions 11 still further includes a flange support panel 51 extending outwardly at a right angle from its respective side panel 50. Each of the side frame portions 11 still further includes a flange 52 extending outwardly at a right angle from flange support panel 51 and parallel to side panel 50. The flange 52 extends for approximately one-half of the length of the flange support panel 51. The flange 52 includes a lip 53 which may be engaged by a handling mechanism. Each of the flange support panels 51 includes an indexing notch 54 to be engaged, for example, by a robotic handling mechanism.

As to the H-shaped end frame portion 13, the tapering foot panels 40, the surface portions 41, the fluid opening 42, the indexing notches 43, and the indexing notches 53, U.S. Pat. No. 4,949,848 assigned to Fluoroware, Inc. of Chaska, Minn. is hereby incorporated by reference.

The end frame portion 14 includes a pair of forked or bifurcated end wall portions 60 formed integrally of the flange support panel 51 of the side frame portions 11. Each of the forked end wall portions 60 includes a pair of end panel portions 61, 62 extending obliquely relative to the flange support panel 51 and cooperating with the panel 51 in forming a triangular-like support column 60.1 at each of the junctures between the end frame portion 14 and the two side frame portions 11. Each of the end panel portions 61 is greater in length than each of the end panel portions 62, and the panel portions extend throughout the full height of end frame portion 14.

The end frame portion 14 also includes a first intermediate panel portion 70 extends between the forked end wall portions 60 at generally a right angle relationship to the sidewalls 20. A second intermediate panel portion 71 also extends between the end panel portions 61 in a parallel, but offset relationship with the first intermediate panel portion 70. The second intermediate panel portion 71 also extends between the foot panel portions 40. The parallel intermediate panel portions 70, 71 are joined via an oblique intermediate panel portion 72 which also extends between the end panel portions 61 at generally a right angle. The oblique intermediate connector panel portion 72 is disposed obliquely relative to the parallel panel portion 70, 71 and is also disposed obliquely relative to each of the end panel portions 61, 62 and the side panel portions 50. Panels 70, 71, 72 are formed integrally of each other and integrally with the panel portions 61, 62 as illustrated.

In operation, when subjected to heat transfer such as a heating up to 180° C. or a cooling after the wafers 12 have been processed, the relative orientations of the portions of the end frame portion 40 cooperate to hold the shape and maintain the structural integrity of the wafer carrier 10. For example, the forked end wall portions 60, the offsetting intermediate panel portions 70, 71, and the oblique intermediate panel portion 72, are features that interact with each other to retain the shape of the wafer carrier 10 through expansion or contraction caused by such heat transfer. Moreover, the substantially identical thickness of the forked end wall portions 60, intermediate panel portions 70, 71, 72, and panels 50, 51, and 52 permits a constant heating or cooling rate for each of these portions such that contraction and or expansion of each of these portions occurs at an identical rate to minimize a warp or distortion of the wafer carrier. Accordingly, damage to the wafers 12 held in the wafer carrier 10 is minimized.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed:

1. A moldable plastic, distortion and warp resistant wafer carrier comprising:
   a) a pair of upright ribbed side frame portions disposed transversely of each other for engaging wafers therebetween and for spacing the wafers apart from each other, each of the side frame portions comprising openings for fluid flow to and from the wafers;
   b) a pair of upright end frame portions disposed between the side frame portions for fixing the side frame portions in a spaced apart relationship; and
   c) one of the end frame portions comprising a pair of upright bifurcated end wall portions and an upright intermediate panel portion integrally joined to and between the bifurcated end wall portions, each of the bifurcated end wall portions being integrally joined with one of the side frame portions, each of the bifurcated end wall portions having a pair of end panel portions extending obliquely of one another and extending obliquely of said intermediate panel portion, whereby the resistance of the wafer carrier to warpage is enhanced.

2. The wafer carrier of claim 1, wherein the thickness of each of the bifurcated end wall portions is approximately equal.

3. The wafer carrier of claim 1, further comprising a pair of flanges integrally extending outwardly from the side frame portions for being engaged by a handling mechanism, each of the bifurcated end wall portions being disposed adjacent to one of the flanges.

4. The wafer carrier of claim 1, and further comprising a bent intermediate panel portion extending between the bifurcated end wall portions.

5. The wafer carrier of claim 1, wherein one of the end panel portions being greater in length than the other end panel portion.

6. The wafer carrier of claim 1 wherein a pair of upright support panels are formed integrally with the bifurcated wall portions to define upwardly extending triangular support columns adjacent the side frame portions.

7. A moldable plastic, distortion and warp resistant wafer carrier comprising:
   a) a pair of ribbed side frame portions transversely of each other for engaging wafers therebetween and for spacing the wafers apart from each other, each of the side frame portions comprising openings for fluid flow to and from the wafers;
   b) a pair of end frame portions integrally joined to and between the side frame portions for fixing the side frame portions in a spaced apart relationship; and
   c) one of the end frame portions comprising an end wall which comprises:
      1) a pair of bifurcated end wall portions, each of the bifurcated end wall portions engaging one of the side frame portions;
      2) a pair of parallel intermediate panel portions one above the other and disposed generally parallel to and offset from each other, one of the parallel intermediate panel portions being disposed at least partially between and engaging the bifurcated end wall portions; and 3) an intermediate connector panel portion disposed between and engaging the offset intermediate panel portions and extending obliquely relative to the parallel intermediate panel portions whereby resistance of the wafer carrier to warpage is enhanced.

8. The wafer carrier of claim 7, wherein the thickness of each of the bifurcated end wall portions is approximately equal.

9. The wafer carrier of claim 7, wherein each of the bifurcated end wall portions comprises a pair of end panel portions, one of the end panel portions being greater in length than the other end panel portion.

10. The wafer carrier of claim 9, wherein the longer of the end panel portions is joined to and between the ribbed side frame portions and each of the intermediate panel portions.

11. The wafer carrier of claim 9, wherein the longer of the end panel portions is disposed obliquely of each of the intermediate panel portions.

12. The wafer carrier of claim 7, wherein the bifurcated end wall portions and the oblique intermediate panel portion are disposed obliquely of each other.

13. A moldable plastic, distortion and warp resistant wafer carrier comprising:
   a) a pair of ribbed side frame portions disposed transversely of each other for engaging wafers therebetween and for spacing the wafers apart from each other, each of the side frame portions comprising openings for fluid flow to and from the wafers;
   b) a pair of end frame portions integrally joined to and between the side frame portions for fixing the side frame portions in a spaced apart relationship;
   c) a pair of flanges integrally extending outwardly from the side frame portions for being engaged by a handling mechanism, the flanges being disposed adjacent on of the end frame portions;
   d) one of the end frame portions comprising:
      1) a pair of branched end wall portions, each of the branched end wall portions engaging one of the side frame portions and comprising a pair of end panel portions, one of the end panel portions being greater in length than the other end panel portions, the end panel portions having an equal thickness;
      2) a pair of parallel intermediate panel portions disposed generally parallel to and offset from each other and being joined to and between at least the longer of the end panel portions, each of the parallel intermediate panel portions extending obliquely relative to the longer of the end panel portions; and
      3) an oblique intermediate panel portion disposed between and engaging the parallel intermediate panel portions and the longer of the end panel portions, the oblique intermediate panel portion extending obliquely relative to the parallel intermediate panel portions and to the longer of the end panel portions whereby resistance of the wafer carrier to warpage is enhanced.

* * * * *

UNITED STATES PATENT AND TRADEMARK OFFICE
CERTIFICATE OF CORRECTION

PATENT NO. : 5,154,301

DATED : October 13, 1992

INVENTOR(S) : Robert D. Kos

It is certified that error appears in the above-identified patent and that said Letters Patent is hereby corrected as shown below:

Column 1, line 32, delete "structura" and insert therefor --structural--.

Column 3, line 14, after "53," insert therefor --the Kos--.

Column 6, line 7, delete the word "on" and insert therefor --one--.

Signed and Sealed this

Twenty-third Day of November, 1993

Attest:

BRUCE LEHMAN

Attesting Officer

Commissioner of Patents and Trademarks